United States Patent [19]

Beha et al.

[11] Patent Number: 5,293,113
[45] Date of Patent: Mar. 8, 1994

[54] TEST INSTRUMENT FOR THE DISPLAY OF ELECTRIC VOLTAGES

[75] Inventors: Christian Beha, Glottertal, Fed. Rep. of Germany; Martin Schwartz, Carrigaline, Ireland

[73] Assignee: Ch. Beha BmbH, Glottertal, Fed. Rep. of Germany

[21] Appl. No.: 960,952

[22] Filed: Oct. 15, 1992

[30] Foreign Application Priority Data

Oct. 21, 1991 [DE] Fed. Rep. of Germany ....... 4134695

[51] Int. Cl.⁵ ..................... G01R 31/02; G08B 21/00
[52] U.S. Cl. ................... 324/72.5; 324/457; 340/661
[58] Field of Search ............... 324/72, 556, 522, 457, 324/536, 551, 530, 531, 72.5; 340/660, 661

[56] References Cited

U.S. PATENT DOCUMENTS

| | | | |
|---|---|---|---|
| 3,412,392 | 11/1968 | Jenkins et al. | 324/556 |
| 3,431,493 | 3/1969 | Knoth et al. | 324/126 |
| 3,786,468 | 1/1974 | Moffitt | 340/660 |
| 4,205,264 | 5/1980 | Gold | 324/72.5 |
| 4,349,783 | 9/1982 | Robson et al. | 324/457 |
| 4,558,309 | 12/1985 | Antonevich | 324/509 |
| 4,758,792 | 7/1988 | Polomis et al. | 324/530 |
| 4,785,294 | 11/1988 | Campbell | 340/661 |
| 4,859,992 | 8/1989 | Haigaard | 324/509 |
| 4,916,570 | 4/1990 | Dale | 340/661 |
| 5,105,181 | 4/1992 | Ross | 340/657 |
| 5,150,038 | 9/1992 | Kanemaru et al. | 324/72.5 |

*Primary Examiner*—Kenneth A. Wieder
*Assistant Examiner*—Maura K. Regan
*Attorney, Agent, or Firm*—Haynes N. Johnson

[57] ABSTRACT

A testing device for single-pole voltage testing comprises, between a test electrode (1) and a ground electrode (2), a high impedance dropping resistor (R1) and a measurement resistor (R2) connected in series. The ground electrode (2) is capacitively coupled to earth through the body of the user. The value of the dropping resistor (R1) is at least 10 times greater than the maximum variation which occurs in the capacitively coupled reactance (C1, C2) of the user relative to the ground, so that the total impedance is almost constant. The voltage drop across the measurement resistor (R2) is amplified, rectified and compared in a comparison circuit with predetermined reference voltages in order to control a light emitting diode indicator (D2, D3, D4, D5) corresponding to the measured voltage. The test device can also be constructed for contactless voltage testing or can also be used as a continuity tester.

20 Claims, 10 Drawing Sheets

TEST INSTRUMENT FOR THE DISPLAY OF ELECTRIC VOLTAGES

The present invention relates to a testing device for indicating electrical voltages. The invention relates particularly but not exclusively to a device comprising a test electrode for testing the object to be tested, a ground electrode and, connected between the test electrode and the ground electrode, a series connected ohmic resistor circuit, the voltage drop across which is tapped and compared with graduated reference voltages.

A testing device suitable for indicating DC voltages or rectified AC voltages, where the voltage of the test object is applied to a series circuit of ohmic resistors acting as a voltage divider is known from DE 28 46 675 C. The voltage at the individual division points of the voltage divider is tapped and compared with a reference voltage derived from the voltage of a supply battery. From the individual comparisons associated light emitting diodes show the voltage range in which the test voltage falls. This testing device is only suitable for two pole voltage testing. In the case of single pole testing, which is also known, the high resistance of the human body is connected in series with the series circuit of the voltage divider. Consequently the difference in voltage between the individual division points is so small that a clear indication of the voltage is no longer guaranteed. The greatly varying ohmic contact resistance between the body of the user and the apparatus, on the one hand, and the ground, on the other hand, makes the apparatus completely unsuitable for single pole indication of voltages.

According to the present invention, there is provided a voltage testing device comprising a test electrode, a grounding electrode adapted to be electrically coupled to a user, a resistor circuit comprising at least first and second resistors connected in series between said test electrode and said grounding electrode, and means for providing a plurality of reference voltages for comparison purposes, wherein the first resistor has an impedance which is substantially greater than the maximum variation in use of the combined compacitive reactances, in series with the resistor circuit, between an object to be tested and the test electrode, between the grounding electrode and the user, and between the user and ground, and wherein the second resistor is a measurement resistor across which a voltage is derived for comparison with said reference voltages.

A testing device in accordance with an embodiment of the invention may operate as a single pole testing device in which a test electrode receives the voltage of the test object. A ground electrode of the testing device is capacitively coupled to earth through the user who holds the testing device in his hand. Between the test electrode and the ground electrode a very high impedance ohmic dropping resistor and an ohmic measurement resistor are connected in series. The impedance of the high impedance dropping resistor is for this purpose several times the effective capacitively coupled reactances for the AC voltage to be tested which are in series with the series circuit of ohmic resistors. These capacitively coupled reactances occur in the first place between the human body of the user and the ground on which the user stands. A further capacitive coupled reactance can occur between the testing device and the hand of the user who holds the testing device. The latter coupled reactance can play only an insignificant role if the ground electrode of the test device projects out of the housing of the testing device so that the user's hand comes into electrical contact with the ground electrode. If such a direct galvanic or electrical contact with the ground electrode is not provided, a higher coupled reactance occurs between the ground electrode of the test device and the hand of the user.

In one embodiment the test electrode is constructed as a probe which is brought into electrically conductive contact with the test object. In another embodiment of the invention contactless testing and indication of the voltage is possible, for which purpose the test electrode is constructed as a sensor which can be applied to the test object without electrical contact. In this case the AC voltage to be examined is capacitively coupled with the sensor so that the capacitively coupled reactance between the test object and the test electrode is also acting in series with the series circuit of the ohmic resistors. In order to keep this capacitively coupled reactance between test object and test electrode as small as possible, the test electrode is preferably constructed as a flat sensor to obtain the largest possible capacitance between the test object and the sensor. Because usually the voltage of cables is examined, the sensor is preferably constructed as a cover plate which can be applied externally on the periphery of the cable and partially encloses the cable. The contactless voltage testing makes it possible to indicate the voltage without removing the insulation of the cable.

Because the value of the high impedance resistor is substantially greater than the capacitive coupled reactances, essentially this high impedance resistor determines the total input complex impedance of the test device. The undefined and continuously changing capacitive coupled reactances have only a very small influence on the complex total impedance. Because of this almost constant total complex impedance, defined substantially by the high impedance dropping resistor, an almost constant AC current is produced through the measurement resistor by the AC voltage to be examined. Consequently the voltage drop through the measurement resistor provides a very exact measure of the voltage to be tested. If the impedance value of the high impedance dropping resistor is selected to be at least 10 times greater than the usually occurring changes in the capacitively coupled reactance, then an accuracy of measurement is obtained which is sufficient for the applications which occur in practice in which, as a rule, only an approximate indication of the value of the voltage to be tested is required. For most applications, with an AC voltage to be tested of about 50 Hz, it has been found that it suffices if the value of the high impedance dropping resistor is greater than about 240 Mohm.

The voltage drop which occurs in the measurement resistor is amplified and rectified, so that it can be compared with reference voltages which are derived from a battery of the testing device. Indication of the voltage range is preferably performed by means of light emitting diodes.

The higher the value of the dropping resistor, the smaller the measurement errors which are caused by changing capacitively coupled reactances. With an appropriately high value dropping resistor, instead of an indication of an approximate voltage, a more exact analog or digital voltage measurement can also be obtained.

In an advantageous embodiment of the invention the testing device also comprises an on-off switch assembly which causes an automatic switching on and off of the entire testing device. Consequently a conventional on-off switch is not present and the batteries of the testing device are only switched on during the actual testing operation itself.

For the measurement of high voltages the high impedance dropping resistor can be connected at the tip of an electrically insulating rod (hot stick) and be connected to the measurement circuit by a conductive element. The measurement circuit is located at the opposite end of the rod, which the user holds in his hand. The user is thereby necessarily protected from contact with the high voltage.

In yet another embodiment of the invention the testing device can also be used as a continuity tester. For this purpose a push button is provided in the testing device which connects a voltage divider, which bridges the high impedance dropping resistor, to the test electrode. A test current supplied from the supply battery of the testing device then flows through the contact electrode of the testing device, the user's body, the test object, the test electrode and the voltage divider connected to the latter. The current which flows through the test object when there is continuity cause a voltage drop in the voltage divider which controls a light emitting diode acting as a continuity indicator. Because a DC current supplied from the battery is used for continuity testing, electrical connection of the user with the contact electrode of the testing device, on the one hand, and with the test object, on the other hand, is necessary. Similarly, the test probe electrode must come into electrical contact with the test object.

To complement the AC voltage testing the device can also be equipped with a DC voltage indicator, for example in accordance with the teaching of DE-OS 22 13 494 or DE-OS 28 30 323.

The invention is explained in more detail below with reference to the embodiments shown in the drawings.

FIG. 3a shows an alternative on-off switch assembly to that shown in FIG. 3 for use with the testing device shown in FIG. 2a.

FIG. 6a shows a side view of the testing device embodiment shown in FIG. 2a.

Figure 1:
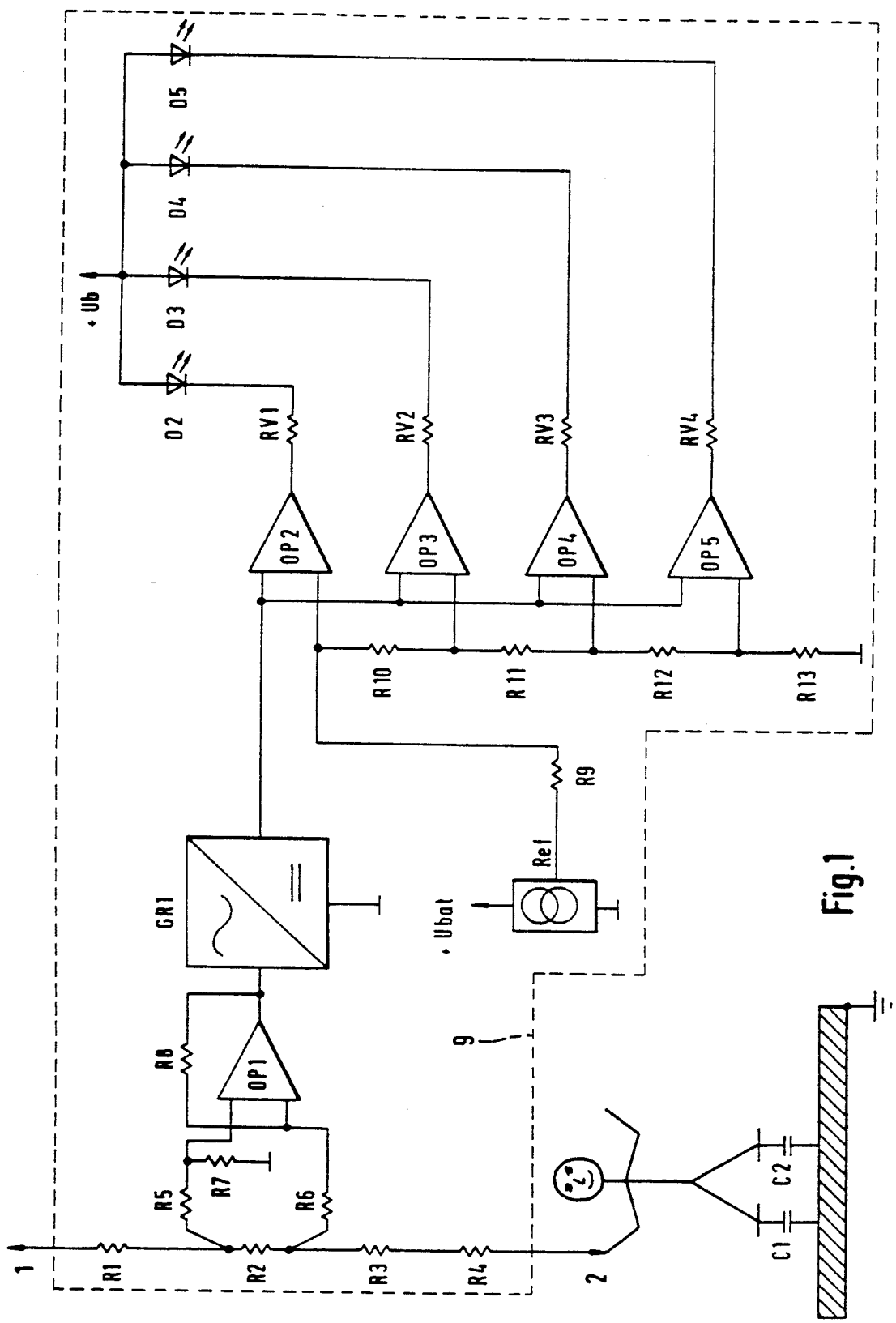
FIG. 1 shows a circuit diagram of the testing device for single pole voltage testing and indication.
Figure 5:
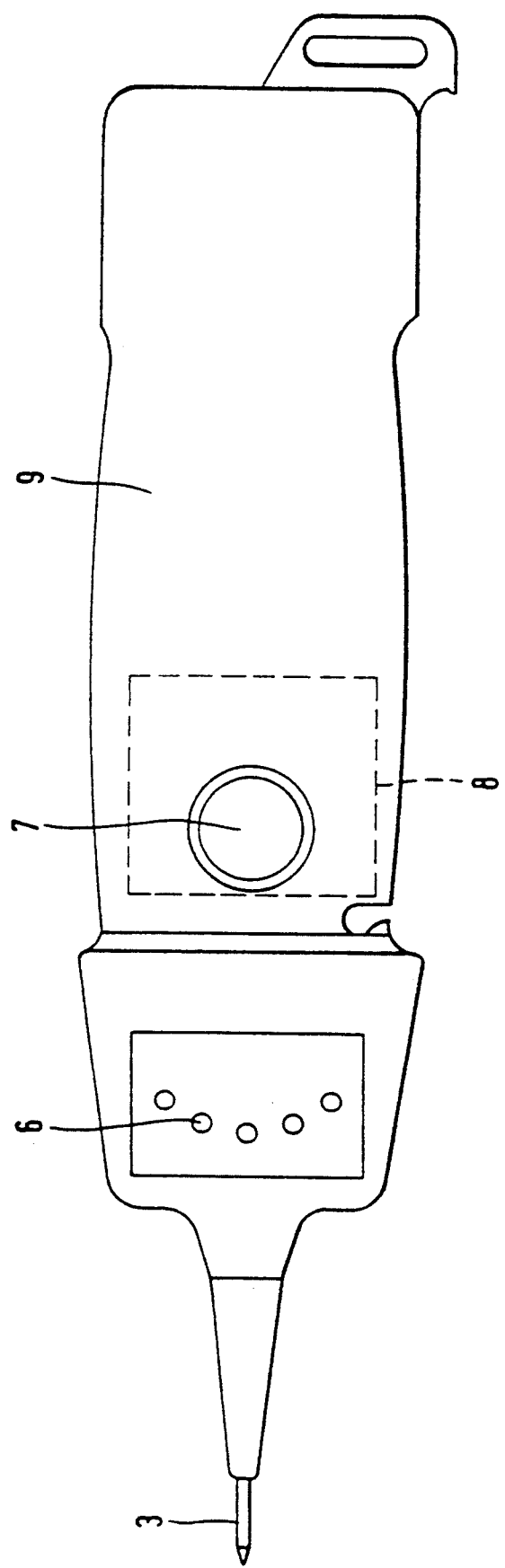
FIG. 5 shows a side view of the testing device embodiment shown in FIG. 1 having the circuit arrangement shown in FIG. 4.

In the embodiment shown in FIGS. 1 and 5 the testing device comprises a housing 9 which accommodates the circuit shown in FIG. 1. A test electrode 1 projects out of the housing 9 and forms there a probe 3 which is brought into electrically conductive contact with the test object. A ground electrode 2 also projects from the housing 9 and is applied externally flat against the housing 9 as a contact electrode 8 (in FIG. 5 on the rear side of the housing). The hand of the user makes contact with the contact electrode 8 so that it is in electrically conductive connection to the body of the user.

A series circuit of ohmic resistors R1, R2, R3 and R4 is connected between the test electrode 1 and the ground electrode 2. The resistor R1 is a very high impedance dropping resistor, the impedance value of which is ten times the capacitively coupled reactance which arises from the parallel connection of the capacitances C1 and C2 between the feet of the user and the ground on which the user stands. In practice, for the testing of AC voltages having a frequency of 50 Hz, a dropping resistor R1 having a value greater than 240 Mohm has been found to be satisfactory.

When the tip of probe 3 of the test electrode 1 is brought into electrically conductive contact with a test object to which an AC voltage is applied, an AC current flows as a measurement current from the test electrode 1, through the series circuit of ohmic resistors R1, R2, R3 and R4, the ground electrode 2, the body of the user and the coupled capacitances C1 and C2 to earth. Because of the high impedance value of the dropping resistor R1, this measurement current is almost independent of the coupled capacitances C1 and C2 which change according to the properties of the floor, the footwear of the user and the position in which he stands. Consequently an almost constant measurement current passes between the test electrode 1 and the ground electrode 2 which is dependent only on the AC voltage applied to the test electrode 1.

The said measurement current produces at the ohmic resistor R2, which acts as a measurement resistor, a voltage drop which is received by a differential amplifier. The differential amplifier consists of the resistors R5, R6, R7, and an operational amplifier OP1 fed back through the resistor R8.

The AC voltage signal of the measurement resistor R2, highly amplified by this differential amplifier, is rectified by a rectifier GR1 and supplied to a comparison circuit.

A supply voltage +Ubat delivers a reference voltage Ref for the comparison circuit through a voltage stabilizer circuit. The reference voltage Ref is applied to a voltage divider which is formed by a series connection of ohmic resistors R9, R10, R11, R12 and R13. The division points of this voltage divider are each connected through one respective input of an operational amplifier OP2, OP3, OP4 and OP5 which acts as a comparator. The amplified and rectified voltage signal from the measurement resistor R2 is applied to the respective other inputs of the said operational amplifier OP2, OP3, OP4 and OP5. The outputs of the operational amplifier OP2, OP3, OP4 and OP5 are applied through respective dropping resistors RV1, RV2, RV3 and RV4 and light emitting diodes D2, D3, D4 and D5 to a battery voltage +Ub. The diode lamps D2, D3, D4 and D5 are visible in a display region of the housing 9 of the testing device, as shown in FIGS. 5 and 6.

If an AC voltage is applied to the test electrode 1, a rectified voltage proportional to the said AC voltage is applied to the first inputs of the operational amplifiers OP2, OP3, OP4 and OP5. The operational amplifiers OP2, OP3, OP4 and OP5 each compare this rectified voltage with the voltage of the associated division point of the voltage divider R9, R10, R11, R12 and R13. If the voltage proportional to the measurement current exceeds the voltage of the particular division point, the associated operational amplifier is switched on and the associated light emitting diode D2, D3, D4 and D5 lights up. By means of suitable selection of the voltage divider resistors R9, R10, R11, R12 and R13, approximate voltage values of 24V, 50V, 120V and 220V can, for example, be assigned to the individual light emitting diodes.

Figure 2:
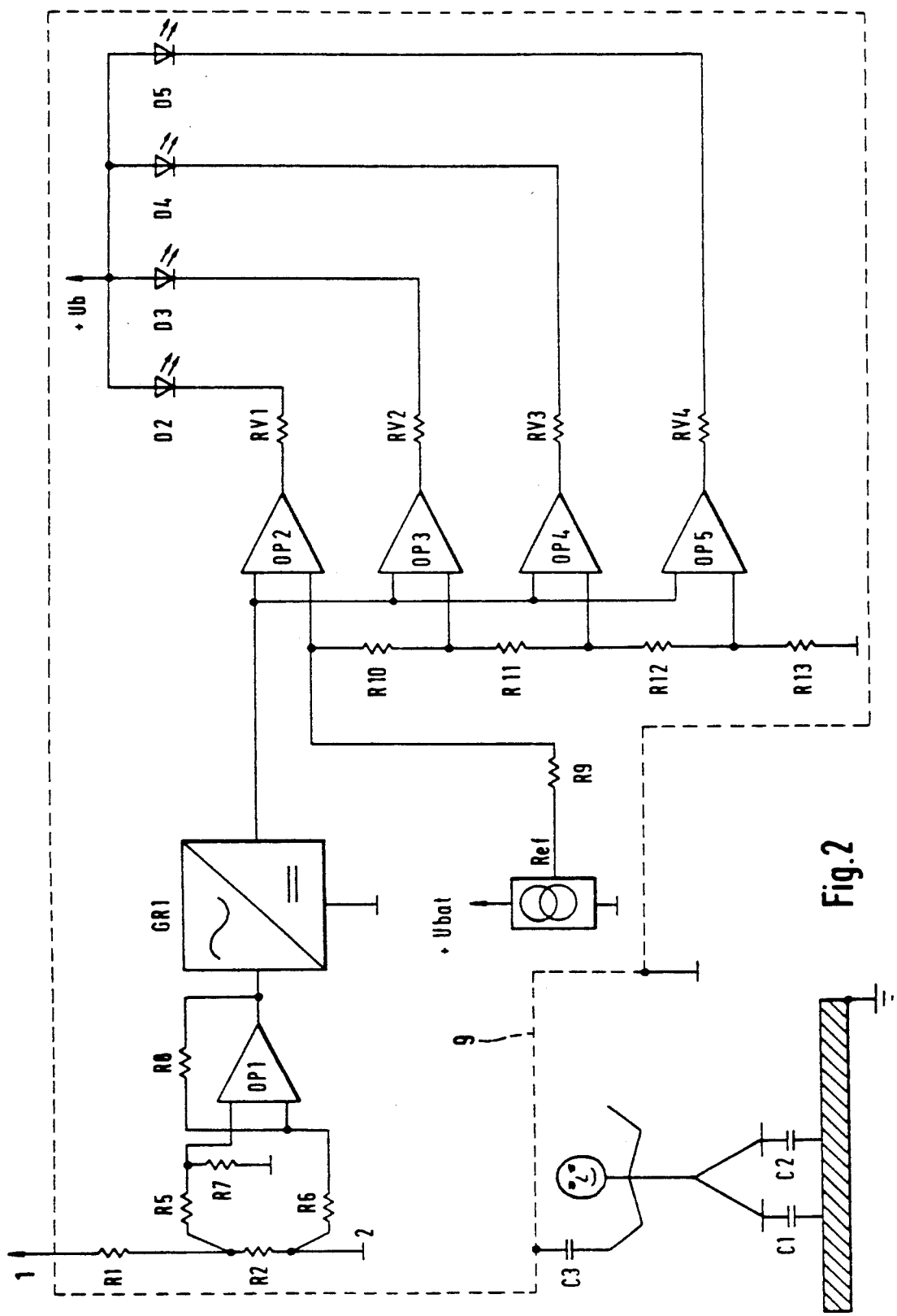
FIG. 2 shows a corresponding circuit diagram of an alternative embodiment of the testing device shown in FIG. 1.
Figure 6:
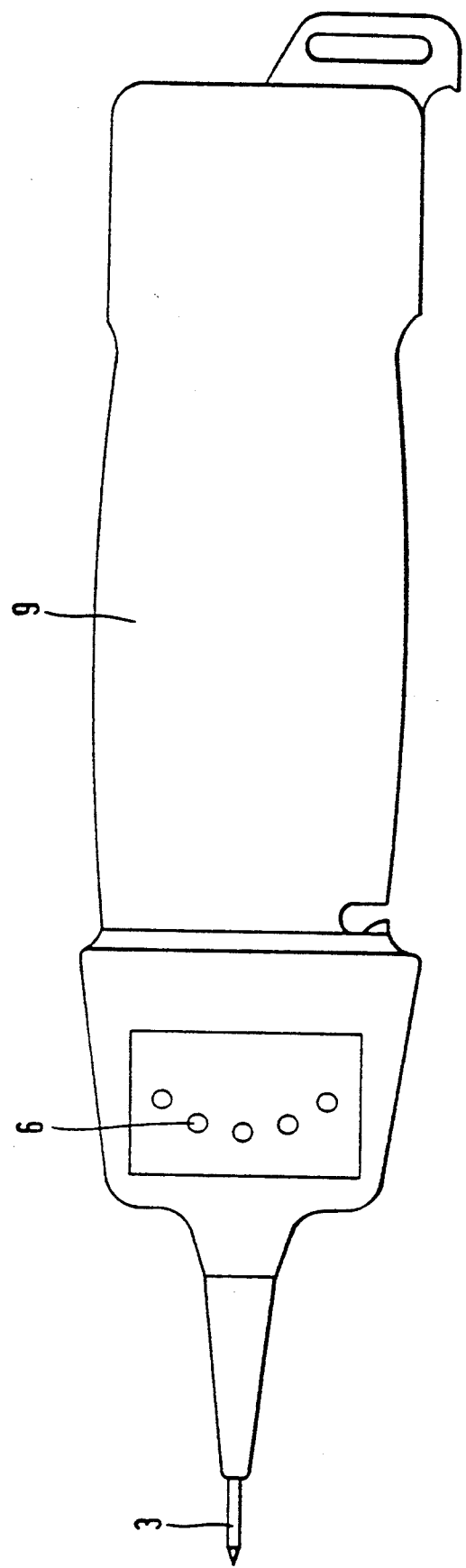
FIG. 6 shows a side view of the testing device embodiment shown in FIG. 2.

FIGS. 2 and 6 show an alternative embodiment of the testing device. In this embodiment the ground electrode 2 in the series circuit comprising the resistors R1 and R2 is not constructed as a contact electrode 8 on the outside of the housing 9. Instead the ground electrode 2 is connected to the ground potential of the circuit and consequently is connected to the housing 9.

In this case there is no electrically conductive contact between the ground electrode 2 and the user's hand. The user's hand and the ground electrode 2 are only capacitively coupled with the coupled capacitance C3. The measuring current thus flows from test electrode 1 in the form of a probe 3 through the high impedance dropping resistor R1, the measurement resistor R2, the coupled capacitance C3 and the coupled capitances C1 and C2, which occur in parallel, to earth. In this case the impedance vaue of the ohmic dropping resistor R1 must be several times, and preferably more than ten times, the capacitive coupled reactance which is produced by the connection following after another of the capacitance C3 and the parallel capacitances C1 and C2.

Figure 2A:
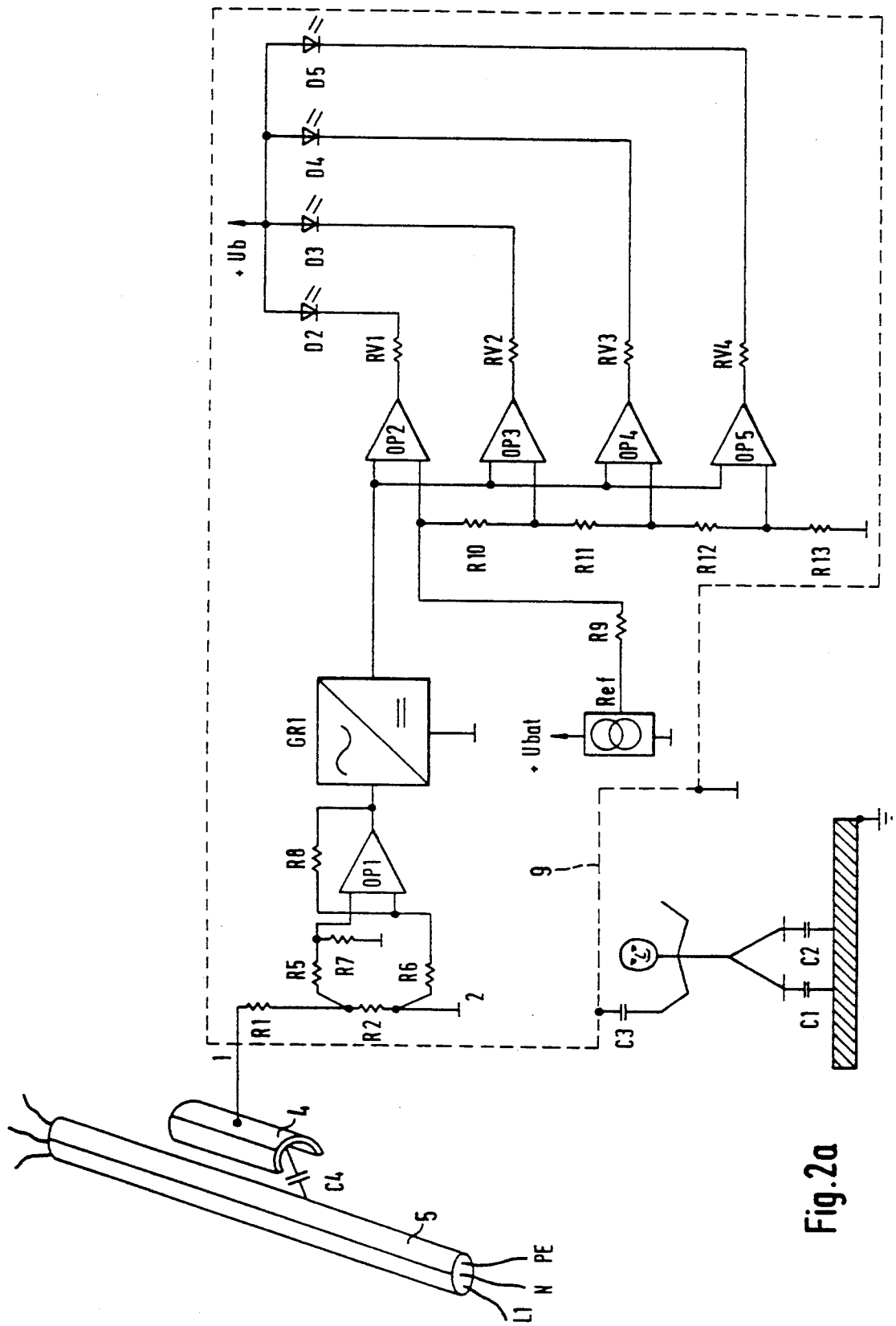
FIG. 2a shows an alternative to the circuit diagram shown in FIG. 2 for a testing device with contactless testing.
Figure 6A:
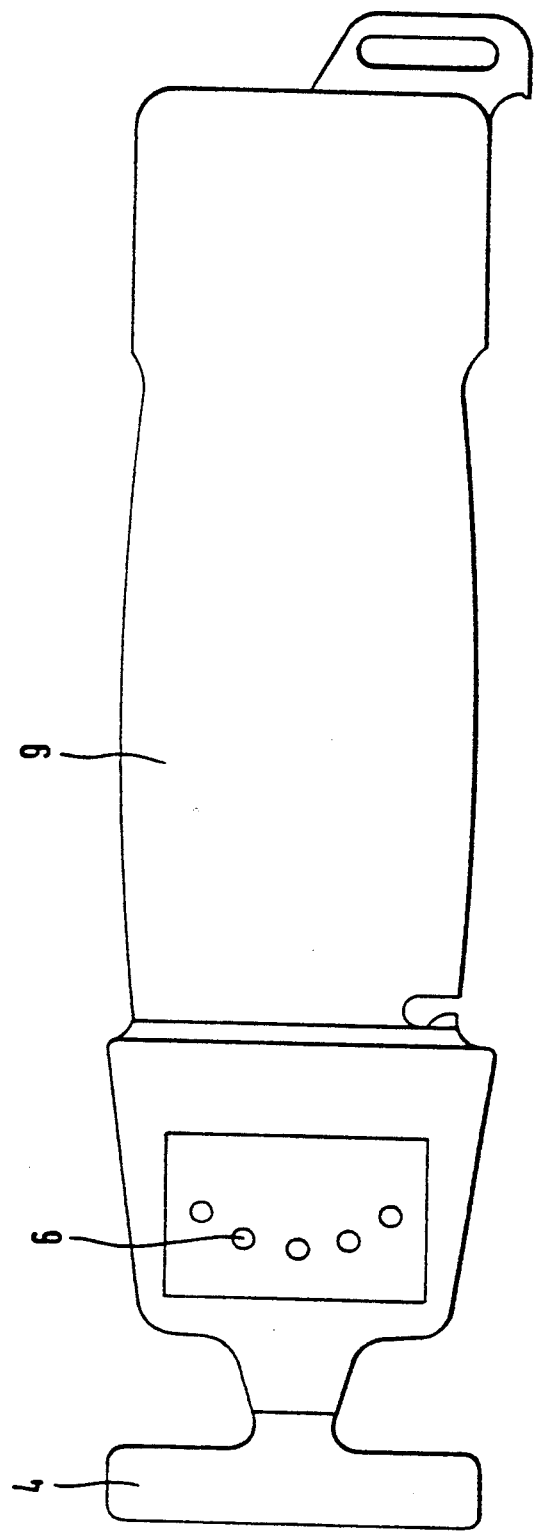

Another embodiment is shown in FIGS. 2a and 6a.

In this embodiment the test electrode 1 is not brought into electrically conductive contact with the test object. Instead the test electrode is built as sensor 4 in the form of a conductive plate. The sensor 4 is applied to the test object so that it is capacitively coupled with the test object by the coupling capacitance C4.

In this embodiment the measurement current flows from the test object through the coupling capacitance C4, the resistors R1 and R2, the coupling capacitance C3, and the parallel coupling capacitances C1 and C2. The impedance value of the high impedance dropping resistor R1 must in this case be several times greater than the capacitively coupled reactance which arises from the coupled capacitances C1, C2, C3 and C4.

If the testing device is used for voltage testing of electrical cables 5, then the sensor 4 is preferably constructed as a semi-cylindrical plate which surrounds the cable 5 like a cover, as is shown in the drawings.

Figure 3:
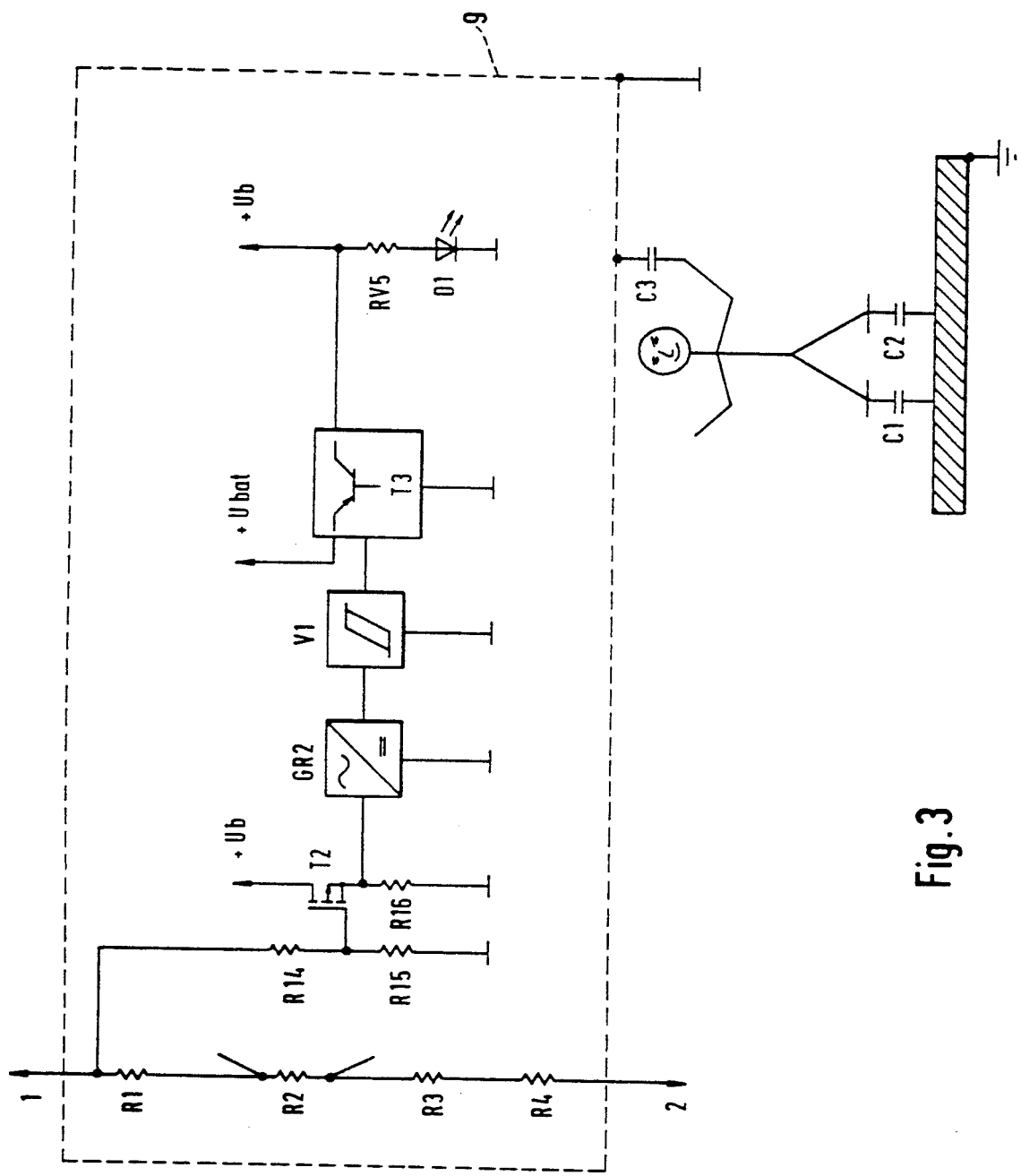
FIG. 3a shows an on-off switch assembly for use with the testing device shown in FIG. 1.
Figure 3A:
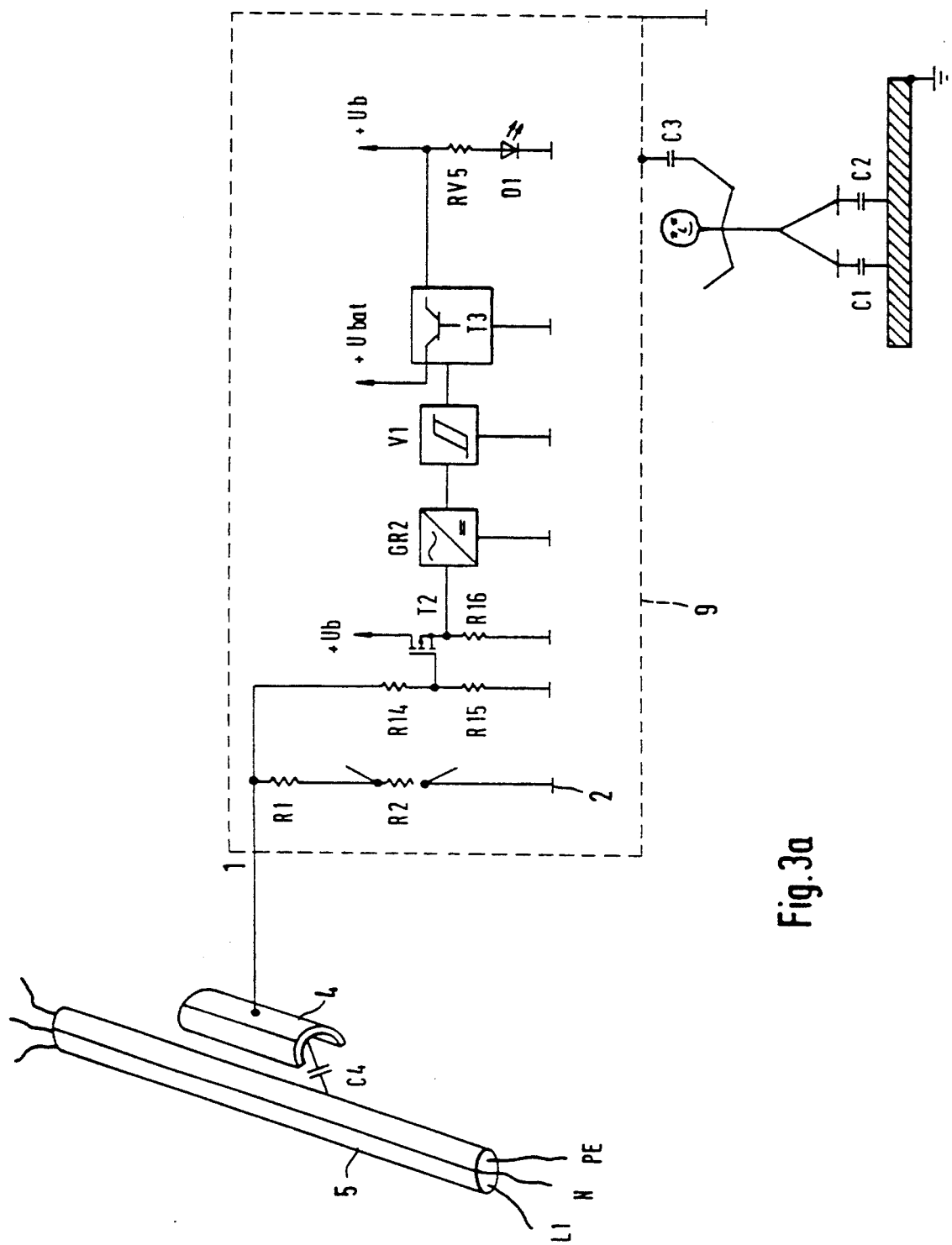

In FIGS. 3 and 3a an on-off switch assembly is shown which can be used in combination with the previously described circuits. FIG. 3 shows the on-off switch assembly in combination with the testing device shown in FIG. 1, whereas FIG. 3a shows the on-off switch assembly in combination with the test device shown in FIG. 2a.

The AC voltage present on the test electrode 1 is connected through the voltage divider R14, R15 to the ground potential of the testing device and thereby through the user to earth. The current flowing through the voltage divider R14, R15 produces a voltage drop through the resistor R15, which switches on a MOSFET-transistor T2 to act as an impedance converter. The current in the MOSFET-transistor T2 produces a voltage drop in the resistor R16 which is rectified by a rectifier GR2 and which, by means of a threshold switch V1, preferably a Schmitt trigger, actuates a drive circuit T3. The drive circuit T3 switches on the voltage of a supply battery +Ub as the supply voltage +Ubat of the whole circuit of the test device. The application of the supply voltage +Ub is shown by a light emitting diode D1 having a resistor RV5 connected in front of it.

The on-off switch assembly ensures that the supply battery and the current-consuming elements of the testing device are only switched on and loaded when the testing device is actually in use and an AC voltage is applied to the test electrode 1. The test electrode therefore does not need any conventional on-off switch and the supply battery is optimally conserved.

Figure 4:
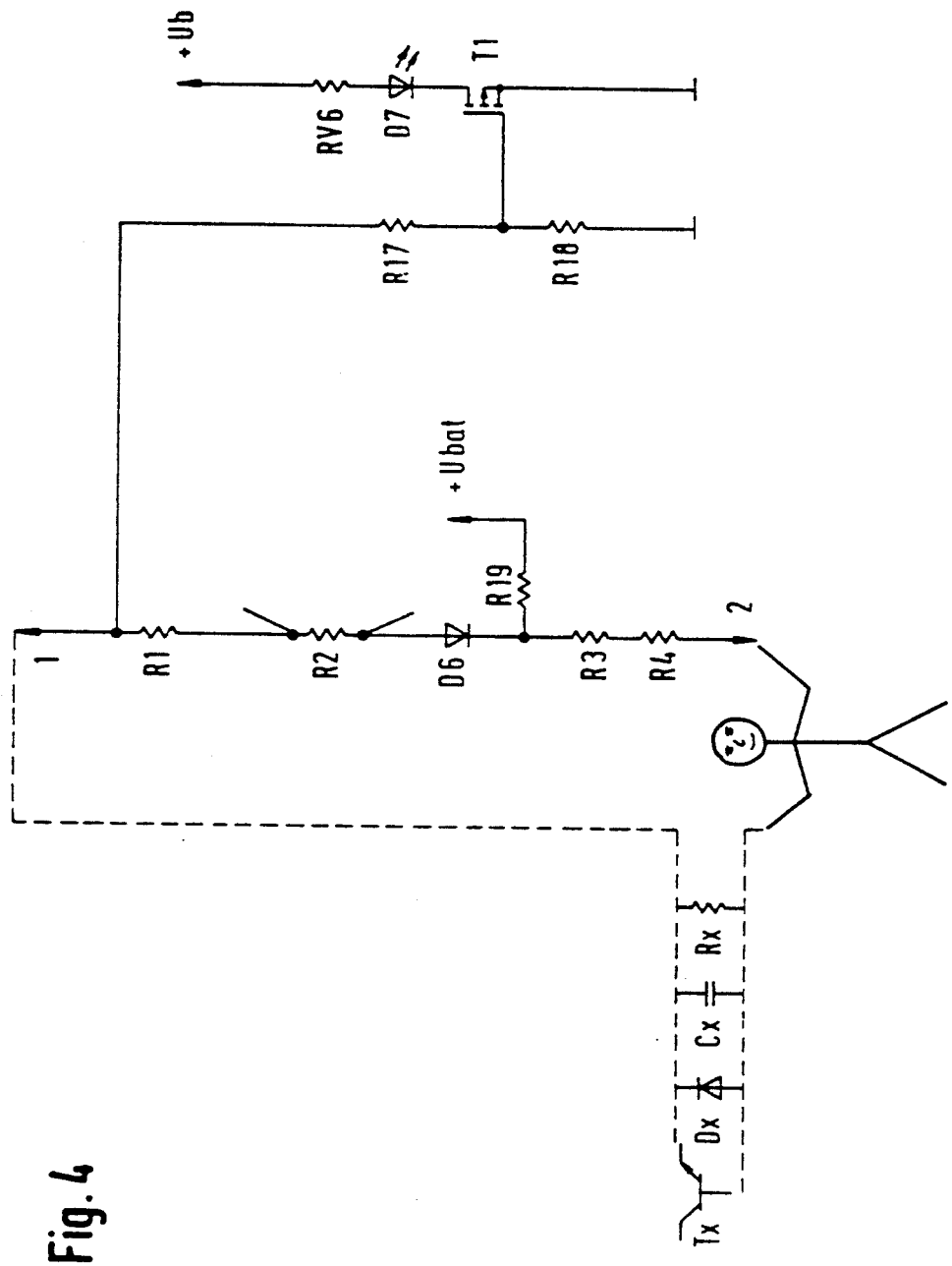
FIG. 4 shows a circuit arrangement for using the testing device shown in FIG. 1 as a continuity tester.

In the embodiment shown in FIG. 1 the testing device can, in addition to being used for voltage testing and display, also be used as a continuity tester, in which the circuit shown in FIG. 1 is complemented by the circuit shown in FIG. 4.

In this a voltage divider consisting of the ohmic resistors R17 and R18 leads from the test electrode 1 to the ground potential of the device. The supply voltage +Ubat is applied across a resistor R19 and the resistors R3 and R4 to the ground electrode 2 which is formed as a contact electrode 8. The user touches with one hand the contact electrode 8, i.e. the ground electrode 2, and with his other hand he touches one end of the test object the continuity of which is to be tested. The test electrode 1 is brought into electrically conductive contact with the other end of the test object.

If there is continuity in the test object, a test current flows through the resistor R19, the resistors R3 and R4, the user's body, the test object, the test electrode 1 and the voltage divider R17, R18. A blocking diode D6 prevents the current flowing through the resistors R1 and R2. This test current produces a voltage drop across the resistor R18 which switches on a highly amplifying MOSFET transistor T1. The current in the MOSFET transistor T1 flows through a light emitting diode D7 connected to a dropping resistor RV6 in order to indicate continuity.

The resistors R3 and R4 serve as protective resistors for the user which limit the current flowing through the user's body to a harmless current strength (this also applies to the outside voltage applied to the test object), even if the high impedance resistors R1 and R19 should fail.

Figure 4A:
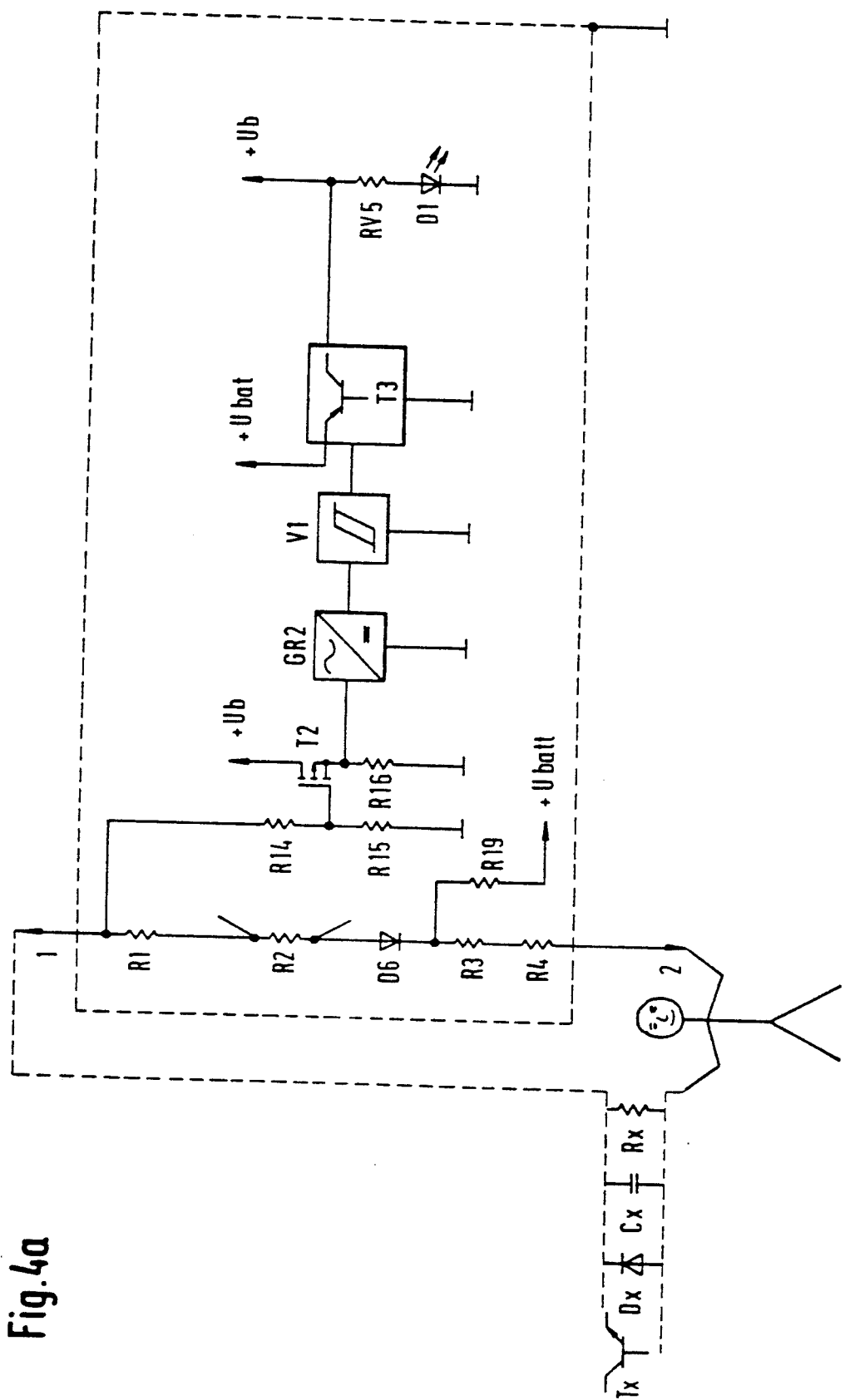
FIG. 4a show a combination of the circuit arrangements shown in FIGS. 3 and 4.

The on-off switch assembly shown in FIG. 3 can also be incorporated in the testing device which is adapted as a continuity tester in accordance with FIG. 4, in order to conserve the supply battery. In order to keep the cost of the circuit as low as possible, the voltage divider R14, R15 can, together with the MOSFET transistor T2 of the on-off switch assembly shown in FIG. 3, also perform the function of the voltage divider R17, R18 and the MOSFET transistor T1 of the continuity tester circuit shown in FIG. 4. In this manner the circuit arrangement shown in FIG. 4a is obtained. In this circuit arrangement the light emitting diode L1 during use as a voltage tester indicates the application of a voltage to the test electrode 1. During use as a continuity tester the light emitting diode L1 indicates that an electrically conductive connection exists between electrodes 1 and 2.

In the embodiment shown in FIG. 1, the testing device is suitable for single pole testing and indication of AC voltages. If the testing device is also equipped with the circuit shown in FIG. 4, then it is also suitable for continuity testing, for polarity testing of sources of rectified voltage, for semi-conductor testing and for capacitor testing. In polarity testing the continuity testing circuit is switched on by actuating the button S1. If during polarity testing the test electrode 1 is applied to the positive pole and the user's hand contacts the negative pole, the light emitting diode D7 of the continuity indicator lights up. If the poles are reversed, i.e. if the test electrode 1 is in contact with the negative pole, the light emitting diode D7 does not light up. Testing of semi-conductor elements, such as diodes and transistors, is performed by continuity testing. Testing of capacitors is similarly performed by continuity testing, whereby on testing a discharged capacitor the test current first charges the capacitor so that during the charging period continuity is indicated.

In the embodiment shown in FIG. 2 the testing device is suitable for single pole testing and indication of AC voltages. Because of the lack of electrical connection with the user's body, continuity testing using a circuit in accordance with FIG. 4 cannot be performed.

In the embodiment shown in FIG. 2a the test device is suitable for contactless single pole testing and indication of AC voltages.

Thus, embodiments of the invention provide a voltage testing device which is suitable for single pole indication of AC voltages and in particular may also make possible contactless examination of voltages.

We claim:

1. A single probe, alternating current voltage testing device comprising a test electrode, a grounding electrode electrically coupled to a user, said user being connected to ground by capacitative reactances, a series resistor circuit comprising at least first and second resistors in series between said test electrode and said grounding electrode, with said first resistor being connected to said test electrode and said second resistor being connected somewhere in said series resistor circuit between said first resistor and said grounding electrode, and means for providing a plurality of reference voltages for comparative purposes, wherein the first resistor has an impedance which is at least ten times as great as the total impedances in series with said series resistor circuit, said impedances in series with said series resistor circuit being, first, any impedance between an object to be tested and said test electrode, second, any impedance existing between said grounding electrode and said user, and, third, any impedance existing between said user and ground, and wherein the second resistor is a measurement resistor across which a voltage is derived for comparison with said reference voltages.

2. A device as claimed in claim 1, which comprises an amplifying circuit arranged to amplify the voltage derived across the measurement resistor, a rectifying circuit for rectifying the output voltage of the amplifying circuit and means for comparing the rectified output of the rectifying circuit with the reference voltages.

3. A device as claimed in claim 2 in which the amplifying circuit comprises a differential amplifier connected across said measurement resistor.

4. A device as claimed in claim 2, in which said comparing means comprises a plurality of comparing circuits each arranged to compare a respective one of said reference voltages with the rectified output of the rectifying circuit.

5. A device as claimed in claim 4, in which said means for providing reference voltages comprises a stabilized voltage source connected to a reference voltage divider consisting of a plurality of ohmic resistors, the division points of the said voltage divider providing said reference voltages, and wherein said comparing circuits comprise a plurality of operational amplifiers, each operational amplifier having one input connected to a respective division point of the voltage divider, the amplified and rectified voltage signal from the measurement resistor being applied on the other input of each operational amplifier, and each operational amplifier being arranged to control a respective indicating element.

6. A device as claimed in claim 1 in which said first and second resistors are ohmic resistors.

7. A device as claimed in claim 6, in which for testing AC voltages of approximately 50 Hz the impedance value of said first resistor is at least 240 Mohm.

8. A device as claimed in claim 1 in which said test electrode is constructed as a probe for making electrical contact with the test object.

9. A device as claimed in claim 8 in which a supply voltage source is connected to said grounding electrode and a current indicator circuit is connected to said test electrode so that said device is operable as a continuity tester.

10. A device as claimed in claim 9, in which said current indicator circuit comprises a test voltage divider connected to said test electrode, the dividing point of which is connected to a semiconductor switch arranged to control an indicating element.

11. A device as claimed in claim 1 in which said test electrode is constructed as a sensor which operates without making electrically conducting contact with the test object.

12. A device as claimed in claim 11 in which said sensor comprises a conductive plate adapted to be applied against the surface of the test object.

13. A device as claimed in claim 12 in which said conductive plate is adapted to fit around an electrical cable.

14. A device as claimed in claim 1, in which said grounding electrode is a contact electrode arranged externally on a housing of the device.

15. A device as claimed in claim 1 in which the grounding electrode is arranged as a ground terminal of the circuit within a housing of the test device.

16. A device as claimed in claim 1 including a supply switching circuit connected to said test electrode so that, when a voltage is applied to said test electrode, the power switching circuit connects a supply voltage source to said device.

17. A device as claimed in claim 16, in which said supply voltage source comprises a battery.

18. A device as claimed in claim 16 in which said supply switching circuit comprises a test voltage divider connected to the test electrode, arranged to control, through an impedance converter and a rectifier, a drive circuit arranged to connect the supply voltage to the device.

19. A device as claimed in claim 18, in which said supply switching circuit further comprises a threshold switch connected between the test voltage divider and the drive circuit.

20. A device as claimed in claim 1, further comprising a protective resistor connected to the grounding electrode in series.

* * * * *